(12) United States Patent
Kuroki et al.

(10) Patent No.: US 12,099,101 B2
(45) Date of Patent: Sep. 24, 2024

(54) MAGNETIC SENSOR

(71) Applicant: TDK Corporation, Tokyo (JP)

(72) Inventors: Koji Kuroki, Tokyo (JP); Ikuhito Onodera, Tokyo (JP); Osamu Harakawa, Tokyo (JP); Makoto Kameno, Tokyo (JP)

(73) Assignee: TDK CORPORATION, Tokyo (JP)

( * ) Notice: Subject to any disclaimer, the term of this patent is extended or adjusted under 35 U.S.C. 154(b) by 172 days.

(21) Appl. No.: 17/788,606

(22) PCT Filed: Dec. 4, 2020

(86) PCT No.: PCT/JP2020/045211
§ 371 (c)(1),
(2) Date: Jun. 23, 2022

(87) PCT Pub. No.: WO2021/131605
PCT Pub. Date: Jul. 1, 2021

(65) Prior Publication Data
US 2023/0037194 A1     Feb. 2, 2023

(30) Foreign Application Priority Data
Dec. 25, 2019   (JP) ................. 2019-235070

(51) Int. Cl.
*G01R 33/09*      (2006.01)
*G01R 33/00*      (2006.01)
(52) U.S. Cl.
CPC ......... *G01R 33/09* (2013.01); *G01R 33/0017* (2013.01)
(58) Field of Classification Search
CPC ............... G01R 33/09; G01R 33/0017; G01R 33/0011; G01R 33/0041; G01R 33/0094;
(Continued)

(56) References Cited

U.S. PATENT DOCUMENTS 5,402,292 A    3/1995  Komoda
5,686,837 A *  11/1997 Coehoorn .............. G01R 33/09
                                                    324/252
(Continued)

FOREIGN PATENT DOCUMENTS

JP       2011007673 A  *  1/2011
JP          5066579 B2    11/2012
(Continued)

OTHER PUBLICATIONS

International Search Report issued in corresponding International Patent Application No. PCT/JP2020/045211, dated Mar. 2, 2021, with English translation.
(Continued)

*Primary Examiner* — Daniel R Miller
(74) *Attorney, Agent, or Firm* — Rimon P.C.

(57) ABSTRACT

To increase, in a magnetic sensor having a magnetoresistive strip and a ferromagnetic film, a magnetic bias to be applied to a magnetoresistive element by magnetically coupling the magnetoresistive strip and ferromagnetic film. A magnetic sensor 1 includes a magnetoresistive strip S, an insulating film 13 that covers the magnetoresistive strip S, and ferromagnetic films M1 and M2 formed on the insulating film 13 and arranged in the x-direction through a magnetic gap G extending in the y-direction. The ferromagnetic films M1 and M2 overlap a plurality of hard magnetic members H through the insulating film 13. This allows two adjacent hard magnetic members H to be magnetically coupled through the ferromagnetic films M1 and M2. This makes it possible to increase the magnetic bias to be applied to a magnetoresistive element R without involving an increase in the size of the hard magnetic member H.

10 Claims, 9 Drawing Sheets

(58) Field of Classification Search
CPC ... G01R 33/0206; G01R 33/091; H10N 50/10
See application file for complete search history.

(56) References Cited

U.S. PATENT DOCUMENTS

| | | |
|---|---|---|
| 6,335,675 B1 * | 1/2002 | Kakinuma ............ H10N 50/10 |
| | | 29/610.1 |
| 2010/0253330 A1 | 10/2010 | Sasaki |
| 2012/0326715 A1 | 12/2012 | Ide et al. |
| 2013/0278251 A1 * | 10/2013 | Ichinohe ............ G01R 15/205 |
| | | 324/252 |
| 2019/0187225 A1 | 6/2019 | Ide |
| 2021/0116518 A1 | 4/2021 | Gokita |

FOREIGN PATENT DOCUMENTS

| | | |
|---|---|---|
| WO | 2011/111648 A1 | 9/2011 |
| WO | 2018/037634 A1 | 3/2018 |
| WO | 2019/139110 A1 | 7/2019 |
| WO | 2019/188186 A1 | 10/2019 |

OTHER PUBLICATIONS

Extended European Search Report issued in corresponding EP Application No. 20904817.2, dated Jan. 4, 2024.

\* cited by examiner

MAGNETIC SENSOR

CROSS REFERENCE TO RELATED APPLICATIONS

This application is the U.S. National Phase under 35 U.S.C. § 371 of International Application No. PCT/JP2020/045211, filed on Dec. 4, 2020, which claims the benefit of Japanese Patent Application No. 2019-235070, filed on Dec. 25, 2019, the entire contents of each are hereby incorporated by reference.

TECHNICAL FIELD

The present invention relates to a magnetic sensor and, more particularly, to a magnetic sensor for detecting an extremely weak magnetic field.

BACKGROUND ART

As described in Patent Document 1, there is known a magnetic sensor of a type that detects the direction and strength of a magnetic field based on a change in the resistance value of a magnetoresistive element. The magnetic sensor described in Patent Document 1 uses a meander-shaped magnetoresistive element to achieve a sufficient resistance value. Further, a plurality of hard magnetic members (magnets) are arranged so as to separate the magnetoresistive element to apply a magnetic bias to the magnetoresistive element. When being applied with a magnetic bias, the magnetoresistive element is ideally put into a single magnetic domain state, allowing a reduction in random noise that may be superimposed on a detection signal.

Further, as illustrated in FIGS. 4 and 5 of Patent Document 1, a soft magnetic member is disposed on both sides of a meander-shaped magnetoresistive strip, thereby shielding an unnecessary external magnetic field and improving detection accuracy.

CITATION LIST

Patent Document

[Patent Document 1] Japanese Patent No. 5066579

SUMMARY OF THE INVENTION

Problem to be Solved by the Invention

However, in the magnetic sensor illustrated in FIGS. 4 and 5 of Patent Document 1, the magnetoresistive strip and the soft magnetic member are significantly separated from each other and, therefore, the soft magnetic member cannot sufficiently exert its effects.

It is therefore an object of the present invention to increase, in a magnetic sensor having a magnetoresistive strip and a ferromagnetic film, a magnetic bias to be applied to a magnetoresistive element by magnetically coupling the magnetoresistive strip and ferromagnetic film.

Means for Solving the Problem

A magnetic sensor according to the present invention includes: a first magnetoresistive strip including a plurality of magnetoresistive elements arranged in a first direction through a plurality of hard magnetic members that apply a magnetic bias; an insulating film that covers the first magnetoresistive strip; and first and second ferromagnetic films formed on the insulating film and arranged in a second direction crossing the first direction through a first magnetic gap extending in the first direction. At least one of the first and second ferromagnetic films overlap the plurality of hard magnetic members through the insulating film.

According to the present invention, the ferromagnetic film overlaps the plurality of hard magnetic members, allowing two adjacent hard magnetic members to be magnetically coupled through the ferromagnetic film. This makes it possible to increase a magnetic bias to be applied to the magnetoresistive element without involving an increase in the size of the hard magnetic member.

In the present invention, at least one of the first and second ferromagnetic films may overlap the plurality of magnetoresistive elements through the insulating film. This makes it possible to effectively apply a magnetic field to be detected to the plurality of magnetoresistive elements.

In the present invention, both the first and second ferromagnetic films may overlap the plurality of hard magnetic members and plurality of magnetoresistive elements through the insulating film. This makes it possible to further increase the magnetic bias and to apply the magnetic field to be detected to the plurality of magnetoresistive elements more effectively.

In the present invention, a part of each of the first and second ferromagnetic films that overlaps the plurality of magnetoresistive elements may have a protruding part protruding from the bottom surface thereof contacting the insulating film toward the plurality of magnetoresistive elements, and the width of the protruding part in the first direction may be smaller than the width of each of the plurality of magnetoresistive elements in the first direction. This allows the magnetic field to be detected to be applied efficiently from the corner portion which is the end portion of the protruding part to the magnetoresistive elements, thereby making it possible to obtain higher sensitivity.

In the present invention, the thickness of the insulating film may be 0.05 μm or more and 0.3 μm or less. This makes it possible to sufficiently increase the magnetic bias while ensuring a sufficient withstand voltage between the ferromagnetic film and the magnetoresistive element.

The magnetic sensor according to the present invention may further include: a second magnetoresistive strip including a plurality of magnetoresistive elements arranged in the first direction through a plurality of hard magnetic members that apply a magnetic bias; and a third ferromagnetic film formed on the insulating film. The first and third ferromagnetic films may be arranged in the second direction through a second magnetic gap extending in the first direction, and at least one of the first and third ferromagnetic films may overlap the plurality of hard magnetic members included in the second magnetoresistive strip through the insulating film. With this configuration, a half bridge circuit can be constituted by the first and second magnetoresistive strips.

The magnetic sensor according to the present invention may further have a compensating coil that applies a cancelling magnetic field to the first and second magnetoresistive strips. The compensating coil may include a first section extending in the first direction along the first magnetoresistive strip and a second section extending in the first direction along the second magnetoresistive strip, and the directions of current flowing in the first and second sections may be opposite to each other. With this configuration, closed-loop control can be performed for the first and second magnetoresistive strips.

The magnetic sensor according to the present invention may further include third and fourth magnetoresistive strips each including a plurality of magnetoresistive elements arranged in the first direction through a plurality of hard magnetic members that apply a magnetic bias. The first and second ferromagnetic films may further form a third magnetic gap extending in the first direction, the first and third ferromagnetic films may further form a fourth magnetic gap extending in the first direction, at least one of the first and second ferromagnetic films may overlap, through the insulating film, the plurality of hard magnetic members included in the third magnetoresistive strip, and at least one of the first and third ferromagnetic films may overlap, through the insulating film, the plurality of hard magnetic members included in the fourth magnetoresistive strip. With this configuration, a full bridge circuit can be constituted by the first to fourth magnetoresistive strips.

The magnetic sensor according to the present invention may further have a compensating coil that applies a cancelling magnetic field to the first to fourth magnetoresistive strips. The compensating coil may include a first section extending in the first direction along the first magnetoresistive strip, a second section extending in the first direction along the second magnetoresistive strip, a third section extending in the first direction along the third magnetoresistive strip, and a fourth section extending in the first direction along the fourth magnetoresistive strip. The direction of current flowing in the first and third sections may be the same, the direction of current flowing in the second and fourth sections may be the same, and the directions of current flowing in the first and second sections may be opposite to each other. With this configuration, closed-loop control can be performed for the first to fourth magnetoresistive strips.

The magnetic sensor according to the present invention may further include first and second terminal electrodes. One end of the first magnetoresistive strip in the first direction may be connected to the first terminal electrode not through another magnetoresistive element applied with the magnetic field to be detected, and the other end of the first magnetoresistive strip in the first direction may be connected to the second terminal electrode not through another magnetoresistive element applied with the magnetic field to be detected. Thus, the first magnetoresistive strip has a linear shape not having a folded structure, so that the relation between the direction of a magnetic bias and the direction of current becomes constant over all the sections of the first magnetoresistive strip. This significantly reduce random noise to allow the detection of an extremely weak magnetic field.

Advantageous Effects of the Invention

As described above, according to the present invention, the magnetoresistive strip and ferromagnetic film are magnetically coupled to form a closed magnetic path, so that it is possible to increase a magnetic bias to be applied to the magnetoresistive element without involving increase in the size of the hard magnetic member.

MODE FOR CARRYING OUT THE INVENTION

Hereinafter, preferred embodiments of the present invention will be described in detail with reference to the accompanying drawings.

First Embodiment

Figure 1:
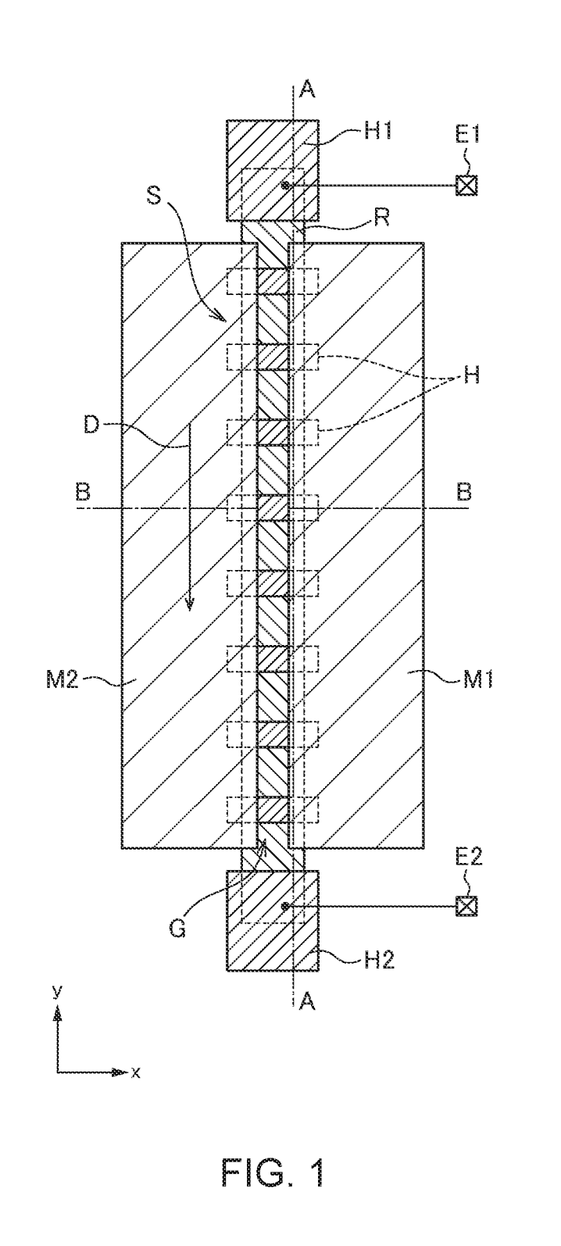
FIG. 1 is a schematic plan view for explaining the structure of a magnetic sensor 1 according to a first embodiment of the present invention.
Figure 2A:
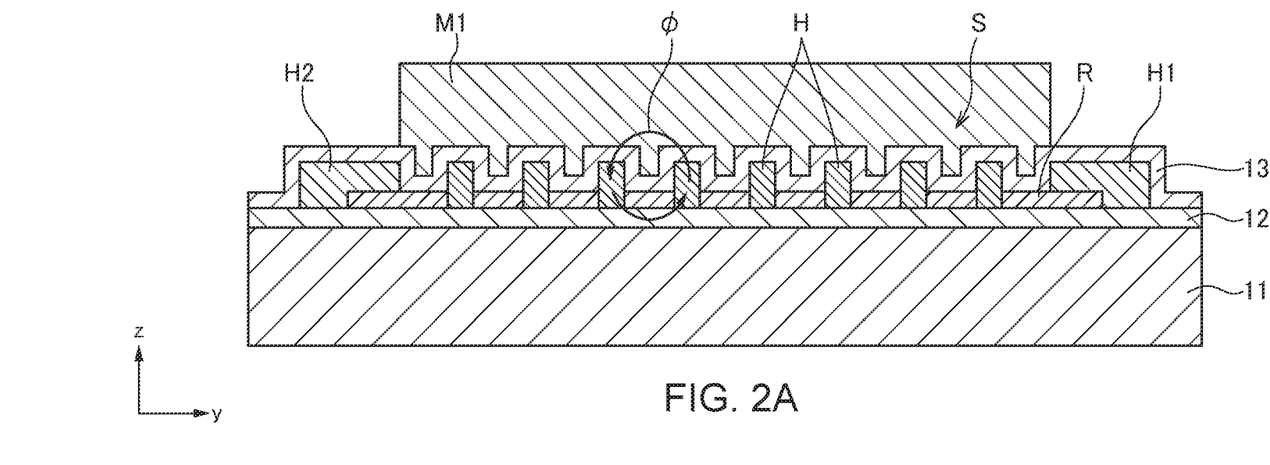
FIG. 2A is a schematic cross-sectional view taken along the line A-A in FIG. 1.

FIG. 1 is a schematic plan view for explaining the structure of a magnetic sensor 1 according to a first embodiment of the present invention. FIG. 2A is a schematic cross-sectional view taken along the line A-A in FIG. 1, and FIG. 2B is a schematic cross-sectional view taken along the line B-B in FIG. 1.

Figure 2B:
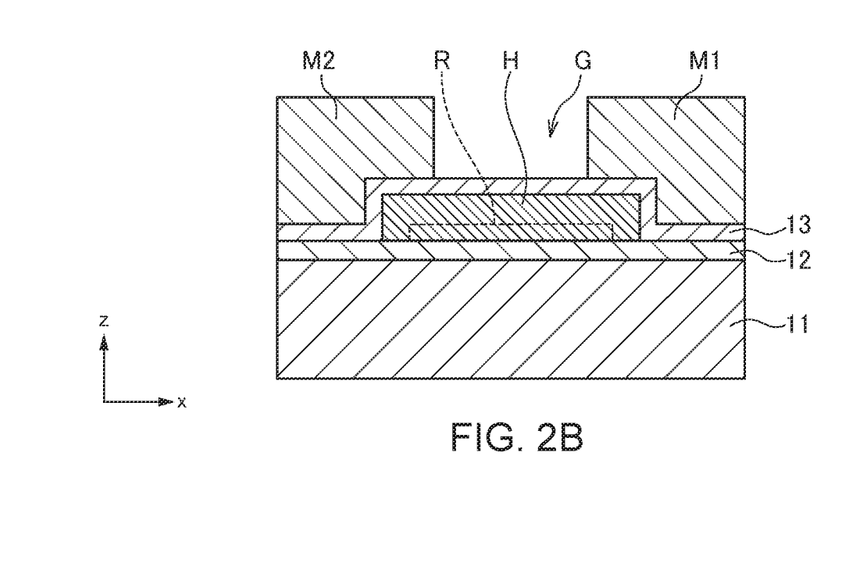
FIG. 2B is a schematic cross-sectional view taken along the line B-B in FIG. 1.

As illustrated in FIGS. 1 and 2, the magnetic sensor 1 according to the present embodiment has a magnetoresistive strip S extending in the y-direction and two ferromagnetic films M1 and M2 arranged in the x-direction. The magnetoresistive strip S is formed on a sensor substrate 11 through an insulating film 12 and includes a plurality of magnetoresistive elements R arranged in the y-direction through a plurality of hard magnetic members (magnets) H. The magnetoresistive element R is not particularly limited in material as long as the resistance value thereof changes depending on the direction and strength of a magnetic field. The magnetoresistive elements R are separated by the plurality of hard magnetic members H in the y-direction and put into a substantially single magnetic domain state by a magnetic bias applied by the hard magnetic members H. This reduces random noise caused due to disturbance of a magnetic domain. To reliably put the magnetoresistive element R into a single magnetic domain state, it is preferable to set the length of the individual magnetoresistive elements R in the y-direction to about several μm.

The magnetoresistive strip S is covered with an insulating film 13 made of $Al_2O_3$ and the like. The ferromagnetic films M1 and M2 are formed on the surface of the insulating film 13. The ferromagnetic films M1 and M2 are arranged in the x-direction through a magnetic gap G extending in the y-direction. In the present embodiment, the magnetic gap G and the magnetoresistive strip S overlap each other in a plan view as viewed in the z-direction. More specifically, the width of the magnetic gap G in the x-direction is smaller than the width of the magnetoresistive strip S in the x-direction, so that the ferromagnetic films M1 and M2 partly overlap the magnetoresistive elements R and hard magnetic members H via the insulating film 13 as viewed in the z-direction. It follows that the magnetic field to be detected going from the ferromagnetic film M1 to the ferromagnetic film M2 or that going from the ferromagnetic film M2 to the ferromagnetic film M1 is applied in the x-direction to the magnetoresistive strip S.

Further, as illustrated in FIG. 2A, two adjacent hard magnetic members H are magnetically coupled to each other through the ferromagnetic films M1 and M2 to form a closed magnetic path, so that a magnetic bias φ to be applied to the magnetoresistive element R is increased as compared to a case where the hard magnetic member H does not overlap the ferromagnetic films M1 and M2. This makes it possible to increase the magnetic bias without enlarging the size of the hard magnetic member H. To enhance magnetic coupling between the hard magnetic member H and the ferromagnetic films M1 and M2, the thickness of the insulating film 13 may be reduced; however, excessively reducing the thickness of the insulating film 13 may cause shortage of withstand voltage between the ferromagnetic films M1, M2 and the magnetoresistive element R. Considering this, the thickness of the insulating film 13 is preferably set to 0.05 μm or more and 0.3 μm or less.

As illustrated in FIG. 1, one end of the magnetoresistive strip S in the y-direction is connected to a terminal electrode E1, and the other end thereof is connected to a terminal electrode E2. More specifically, the one end of the magnetoresistive strip S in the y-direction is connected to the terminal electrode E1 not through another magnetoresistive element applied with the magnetic field to be detected, and similarly, the other end of the magnetoresistive strip S in the y-direction is connected to the terminal electrode E2 not through another magnetoresistive element applied with the magnetic field to be detected. That is, in the present embodiment, the magnetoresistive strip S has a linear shape not having a folded structure. The terminal electrodes E1 and E2 are connected to a not-shown detection circuit, whereby the magnetic field to be detected can be measured based on a resistance value between the terminal electrodes E1 and E2.

Figure 3:
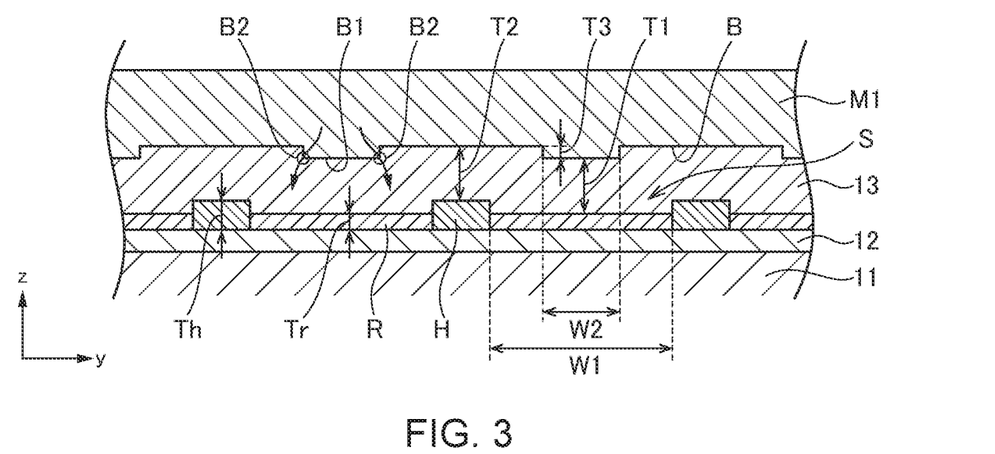
FIG. 3 is an enlarged view corresponding to the cross section taken along the line A-A in FIG. 1, which explains the positional relation between the magnetoresistive strip S and the ferromagnetic film M1.

FIG. 3 is an enlarged view corresponding to the cross section taken along the line A-A in FIG. 1, which explains the positional relation between the magnetoresistive strip S and the ferromagnetic film M1.

As illustrated in FIG. 3, the upper surface of the insulating film 13 is not flat but has irregularity reflecting the steps formed by the magnetoresistive element R and hard magnetic member H. That is, assuming that the thickness of the magnetoresistive element R is Tr and that the thickness of the hard magnetic member H is Th, Tr is less than Th (Tr<Th), that is, the hard magnetic member H is thicker than the magnetoresistive element R. Thus, when the insulating film 13 is formed using a film forming method like an ALD method in which the surface property of an underlying layer is reflected as it is, the upper surface of the insulating film 13 has a recess at a part thereof that covers the magnetoresistive element R having a smaller thickness. In a case where the insulating film 13 is formed by the ALD method, assuming that the thickness of a part of the insulating film 13 that covers the magnetoresistive element R is T1 and that a part thereof that covers the hard magnetic member H is T2, T1 is nearly equal to T2 (T1≈T2), and a height T3 of the step is nearly equal to a value obtained by Th−Tr (T3≈Th−Tr). Further, when using the ALD method, the insulating film 13 covers also a part of the side surface portion of the hard magnetic member H, so that assuming that the length of the magnetoresistive element R in the y-direction is W1 and that the length of the insulating film 13 in the y-direction is W2, W1 is larger than W2 (W1>W2).

When the ferromagnetic films M1 and M2 are formed on the surface of the insulating film 13 having such a surface shape, a bottom surface B of each of the ferromagnetic films M1 and M2 constitutes, at a part thereof contacting the recess of the insulating film 13, a protruding part B1 protruding toward the magnetoresistive element R. The width of the protruding part B1 in the y-direction is also W2. In the present embodiment, such a protruding part B1 is formed above the magnetoresistive element R, so that a magnetic field to be detected concentrates on corner parts B2 positioned at both ends of the protruding part B1 in the y-direction and is thus effectively applied to the magnetoresistive element R.

Figure 4A:
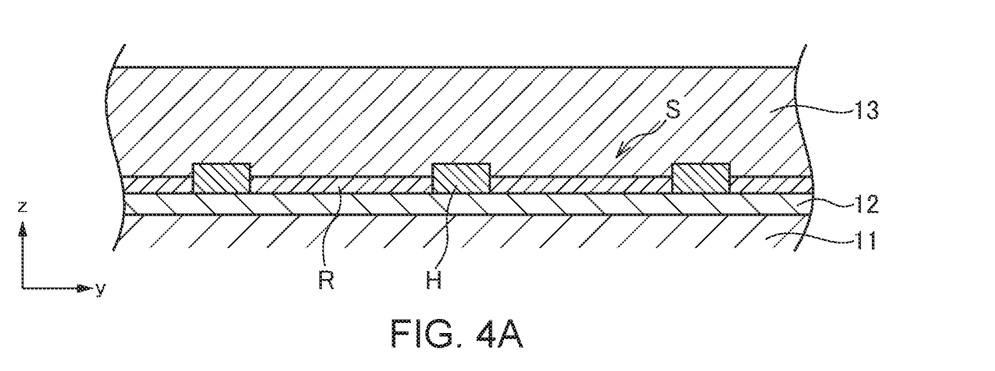
FIGS. 4A and 4B are schematic diagrams for explaining a manufacturing method of the insulating film 13 according to a modification.
Figure 4B:
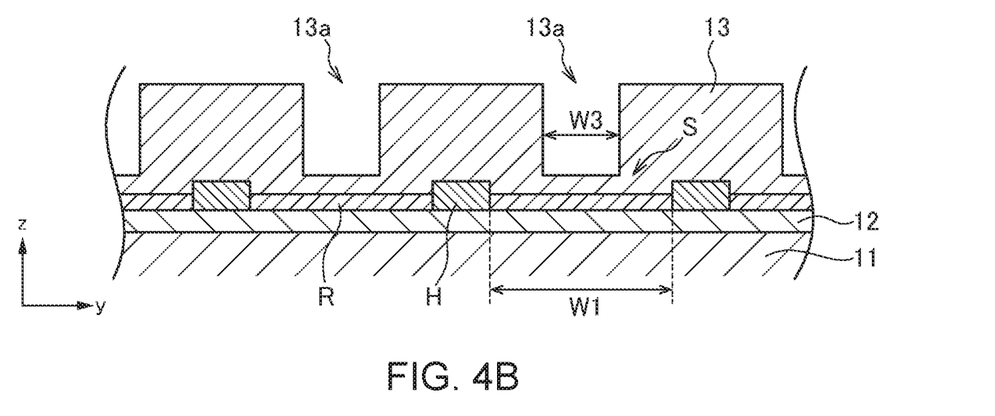

As described above, when the insulating film 13 is formed using a film forming method, such as the ALD method, in which the surface property of an underlying layer is reflected as it is, the protruding part B1 can be formed on the bottom surface B of each of the ferromagnetic films M1 and M2. However, it is not essential, for the formation of the insulating film 13, to use the film forming method such as the ALD method, and a film forming method in which the surface property of an underlying layer is less likely to be reflected may be used. For example, it is possible that after the insulating film 13 is formed so as to have a flat surface, as illustrated in FIG. 4A, a trench 13a having a width W3 in the y-direction smaller than the width W1 is formed in the insulating film 13, as illustrated in FIG. 4B. When irregularity is formed on the surface of the insulating film 13 by such a method, the position and size of the protruding part B1 of each of the ferromagnetic films M1 and M2 can be designed as desired.

As described above, in the magnetic sensor 1 according to the present embodiment, the hard magnetic member H and the ferromagnetic films M1 and M2 overlap each other, thus making it possible to increase a magnetic bias to be applied to the magnetoresistive element R. Further, the magnetoresistive element R and the ferromagnetic films M1 and M2 also overlap each other, and the bottom surface B of each of the ferromagnetic films M1 and M2 has, at a part thereof that overlaps the magnetoresistive element R, the protruding part B1, thus making it possible to effectively apply a magnetic field to be detected to the magnetoresistive element R.

In addition, in the magnetic sensor 1 according to the present embodiment, the magnetoresistive strip S has a linear shape not having a folded structure, so that unlike when the magnetoresistive strip S is folded in a meander shape, the relation between the direction D of the magnetic bias and the direction of flow of current becomes constant over the entire area. This significantly reduce random noise to allow for detection of an extremely weak magnetic field.

Further, in the present embodiment, one end and the other end of the magnetoresistive strip S are covered respectively with end hard magnetic members H1 and H2. The end hard magnetic members H1 and H2 have a size larger than that of the other hard magnetic members H. The ferromagnetic films M1 and M2 do not overlap the end hard magnetic members H1 and H2 as viewed in the z-direction, so that the magnetic field to be detected collected by the ferromagnetic films M1 and M2 is less likely to be taken into the end hard magnetic members H1 and H2. This makes it possible to effectively apply the magnetic field to be detected, to the magnetoresistive strip S.

Figure 5:
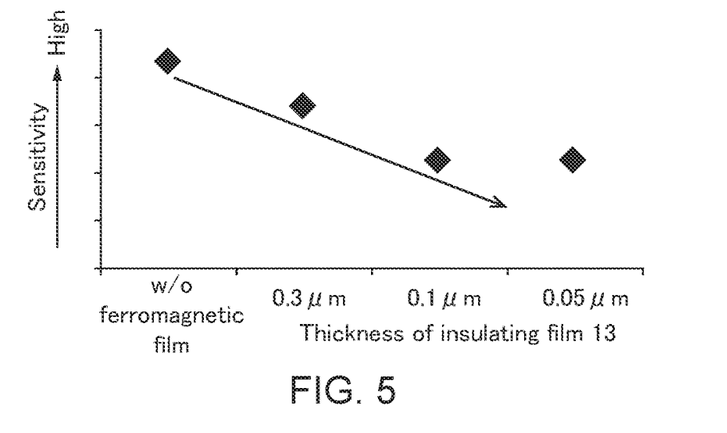
FIG. 5 is a graph illustrating the relation between the film thickness of the insulating film 13 and the sensitivity of the individual magnetoresistive element R.
Figure 6:
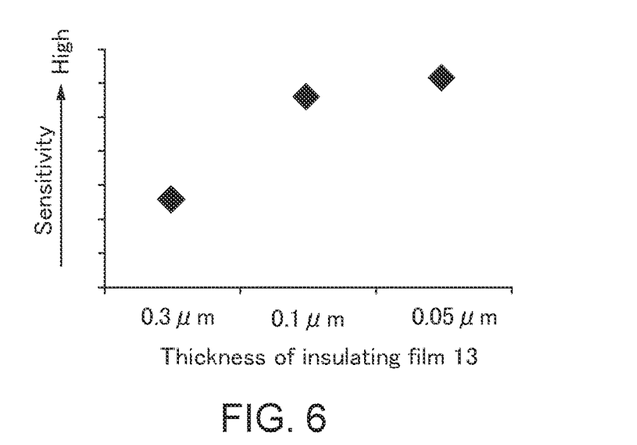
FIG. 6 is a graph illustrating the relation between the film thickness of the insulating film 13 and the sensitivity of the magnetic sensor 1.
Figure 7:
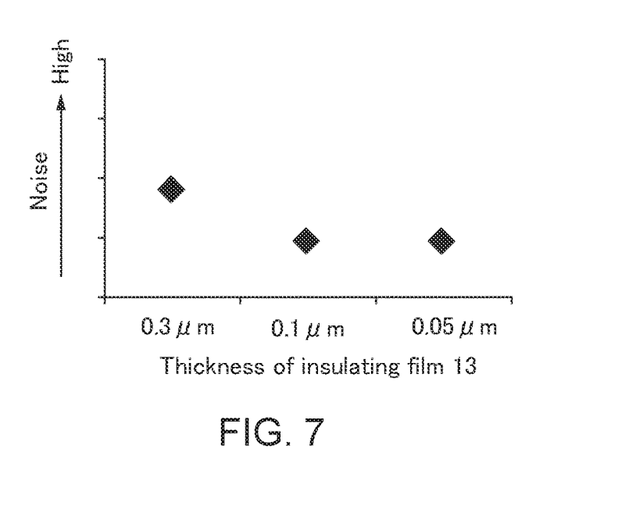
FIG. 7 is a graph illustrating the relation between the film thickness of the insulating film 13 and noise of the magnetic sensor 1.

FIG. 5 is a graph illustrating the relation between the film thickness of the insulating film 13 and the sensitivity of the individual magnetoresistive element R, FIG. 6 is a graph illustrating the relation between the film thickness of the insulating film 13 and the sensitivity of the magnetic sensor 1, and FIG. 7 is a graph illustrating the relation between the film thickness of the insulating film 13 and noise of the magnetic sensor 1.

As illustrated in FIG. 5, the sensitivity of the individual magnetoresistive element R is reduced by the presence of the ferromagnetic films M1 and M2, and the reduction amount becomes conspicuous as the film thickness of the insulating film 13 is reduced. This is because the two adjacent hard magnetic members H are more strongly coupled through the ferromagnetic films M1 and M2 as the film thickness of the insulating film 13 is reduced to increase the magnetic bias, which makes the resistance value less likely to vary due to the magnetic field to be detected. However, as illustrated in FIG. 6, the sensitivity of the magnetic sensor 1 as a whole becomes higher as the film thickness of the insulating film 13 is smaller. This means that the effect of magnetic field concentration on the magnetoresistive element R due to reduction in the film thickness of the insulating film 13 is larger than reduction in the sensitivity of the individual magnetoresistive element R due to reduction in the film thickness of the insulating film 13. Further, as illustrated in FIG. 7, the noise of the magnetic sensor 1 becomes less as the film thickness of the insulating film 13 is smaller. This means that increase in the magnetic bias due to reduction in the film thickness of the insulating film 13 causes reduction in noise.

As illustrated in FIGS. 6 and 7, more favorable values are obtained for the sensitivity and noise of the magnetic sensor 1 as the film thickness of the insulating film 13 is smaller; however, a large difference is not recognized between a case where the film thickness of the insulating film 13 is 0.1 μm and a case where it is 0.05 μm, and it seems that the effect is almost saturated at about 0.1 μm.

Further, when the film thickness of the insulating film 13 is reduced to less than 0.05 μm, the withstand voltage between the ferromagnetic films M1, M2 and the magnetoresistive element R may become insufficient. Considering this, the film thickness of the insulating film 13 is preferably designed to be 0.05 μm or more and 0.3 μm or less, and more preferably to be about 0.1 μm.

Second Embodiment

Figure 8:
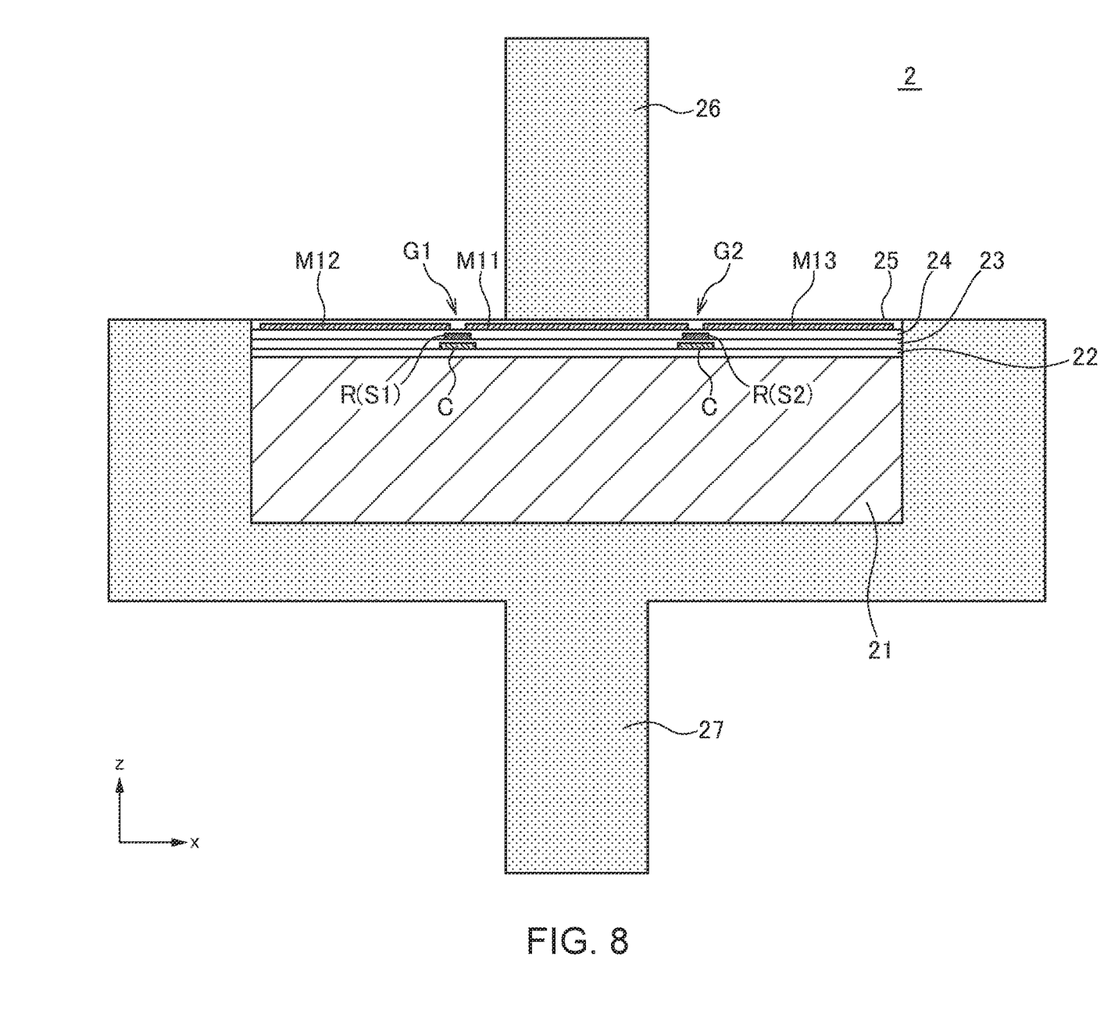
FIG. 8 is a schematic cross-sectional view for explaining the structure of a magnetic sensor 2 according to a second embodiment of the present invention.
Figure 9:
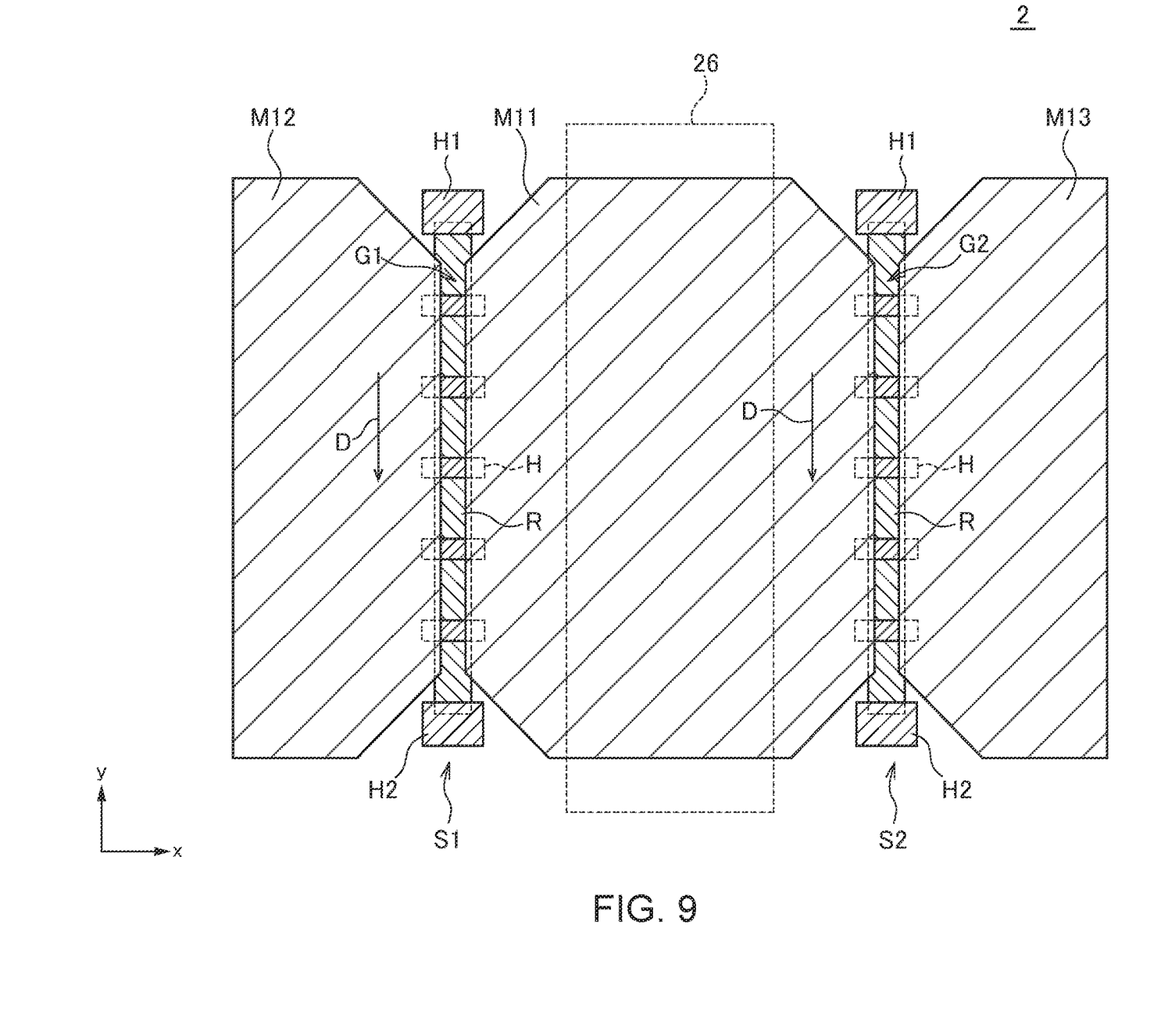
FIG. 9 is a schematic plan view for explaining the structure of a magnetic sensor 2 according to a second embodiment of the present invention.

FIGS. 8 and 9 are schematic cross-sectional and plan views, respectively, for explaining the structure of a magnetic sensor 2 according to a second embodiment of the present invention.

As illustrated in FIGS. 8 and 9, the magnetic sensor 2 according to the second embodiment has insulating films 22 to 25 laminated in this order on a sensor substrate 21, a compensating coil C provided on the surface of the insulating film 22, two magnetoresistive strips S1 and S2 provided on the surface of the insulating film 23, and three ferromagnetic films M11 to M13 provided on the surface of the insulating film 24.

The magnetoresistive strips S1 and S2 each include a plurality of magnetoresistive elements R arranged in the y-direction through a plurality of hard magnetic members H. Both in the magnetoresistive strips S1 and S2, a magnetic bias is applied by the hard magnetic member H in the direction D. The ferromagnetic films M11 and M12 are arranged in the x-direction through a magnetic gap G1 extending in the y-direction, and the ferromagnetic films M11 and M13 are arranged in the x-direction through a magnetic gap G2 extending in the y-direction. The magnetoresistive strip S1 is disposed at a position overlapping the magnetic gap G1, and the magnetoresistive strip S2 is disposed at a position overlapping the magnetic gap G2. The plurality of magnetoresistive elements R and plurality of hard magnetic members H constituting the magnetoresistive strip S1 overlap the ferromagnetic films M11 and M12 through the insulating film 24, and the plurality of magnetoresistive elements R and plurality of hard magnetic members H constituting the magnetoresistive strip S2 overlap the ferromagnetic films M11 and M13 through the insulating film 24.

The magnetic sensor 2 according to the present embodiment further has an external magnetic member 26 provided on the upper surface side of the sensor substrate 21 and an external magnetic member 27 that covers the back and side surfaces of the sensor substrate 21. The external magnetic members 26 and 27 are each made of a soft magnetic material such as ferrite and efficiently collect the magnetic field to be detected in the z-direction. The external magnetic member 26 is provided so as to cover the ferromagnetic film M11 through the insulating film 25, whereby the z-direction magnetic field to be detected collected by the external magnetic member 26 is taken into the ferromagnetic film M11 and is then distributed to the ferromagnetic films M12 and M13 through the magnetic gaps G1 and G2, respectively. The magnetic field to be detected going from the ferromagnetic film M11 to the ferromagnetic film M12 is applied in the negative x-direction to the magnetoresistive strip S1, and that going from the ferromagnetic film M11 to the ferromagnetic film M13 is applied in the positive x-direction to the magnetoresistive strip S2. That is, the magnetoresistive strips S1 and S2 are applied in mutually opposite directions with the magnetic field to be detected.

Figure 10:
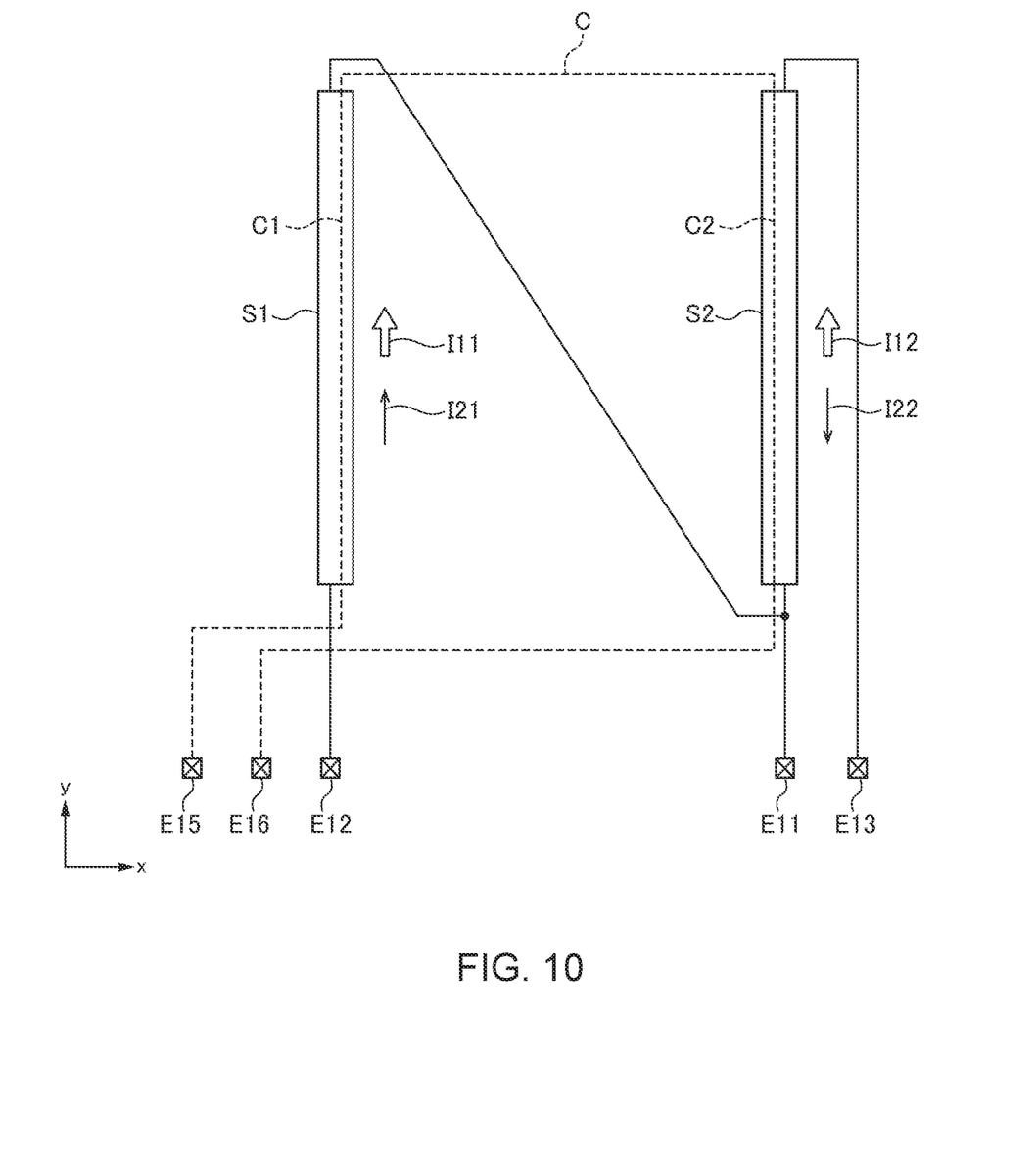
FIG. 10 is a schematic diagram for explaining a connection relation between the magnetoresistive strips S1, S2 and the compensating coil C and the terminal electrodes E11-E13, E15, and E16.

As illustrated in FIG. 10, one end of the magnetoresistive strip S1 in the y-direction is connected to a terminal electrode E11, and the other end thereof is connected to a terminal electrode E12. On the other hand, one end of the magnetoresistive strip S2 in the y-direction is connected to a terminal electrode E13, and the other end thereof is connected to the terminal electrode E11. As a result, the magnetoresistive strips S1 and S2 constitute a half-bridge circuit. In the present embodiment as well, connection between the terminal electrode (E11 to E13) and the magnetoresistive strip (S1 and S2) is made not through another magnetoresistive element applied with the magnetic field to be detected. Thus, when current is made to flow from the terminal electrode E12 toward the terminal electrode E13, current flows in the magnetoresistive strip S1 in the direction denoted by the arrow I11, and current flows in the magnetoresistive strip S2 in the direction denoted by the arrow I12. That is, current flows in the magnetoresistive strips S1 and S2 in the same direction. Since the magnetoresistive strips S1 and S2 are applied with the magnetic field to be detected in mutually opposite directions, it is possible to measure the direction and strength of the magnetic field to be detected by monitoring the potential of the terminal electrode E11 using a not-shown detection circuit.

Further, as illustrated in FIG. 10, one end of the compensating coil C is connected to the terminal electrode E15, and the other end thereof is connected to the terminal electrode E16. The compensating coil C is provided for applying a cancelling magnetic field to the magnetoresistive strips S1 and S2, whereby so-called closed-loop control can be performed. The compensating coil C includes a section C1 extending in the y-direction along the magnetoresistive strip S1 and a section C2 extending in the y-direction along the magnetoresistive strip S2. When current is made to flow from the terminal electrode E15 toward the terminal electrode E16, current flows in the section C1 in the direction denoted by the arrow 121, and current flows in the section C2 in the direction denoted by the arrow 122. That is, current flows in the sections C1 and C2 in mutually opposite directions. This allows for cancellation of the magnetic field to be detected applied to the magnetoresistive strips S1 and S2 in mutually opposite directions by means of the compensating coil C.

As described above, the two magnetoresistive strips S1 and S2 of the magnetic sensor 2 according to the present embodiment do not have a folded structure and are connected such that current flows therein in the same direction. As a result, the relation between the direction of the magnetic bias and the direction of flow of current becomes constant over all the sections of each of the magnetoresistive strips S1 and S2. This significantly reduces random noise to allow for detection of an extremely weak magnetic field.

Third Embodiment

Figure 11:
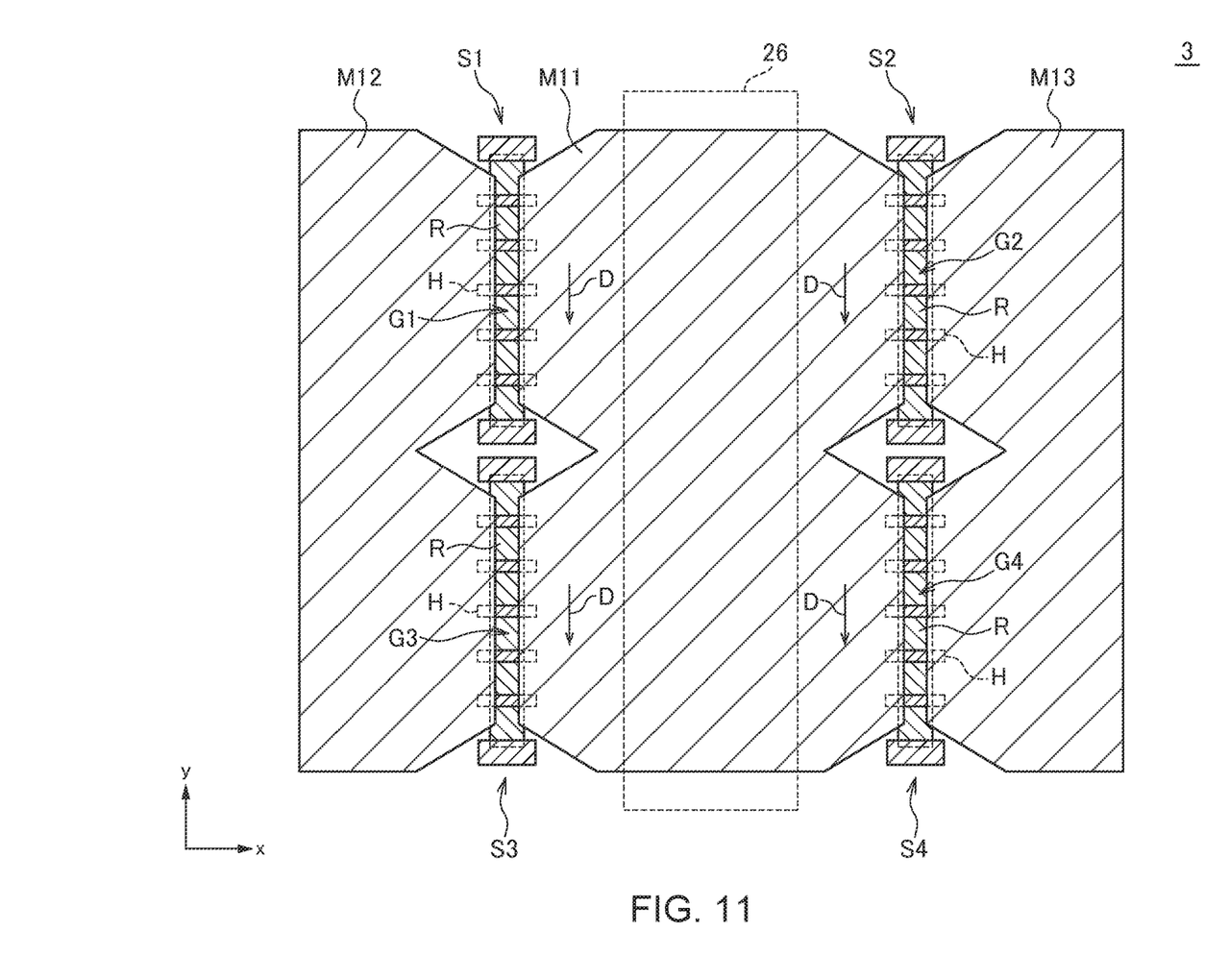
FIG. 11 is a schematic plan view for explaining the structure of a magnetic sensor 3 according to a third embodiment of the present invention.

FIG. 11 is a schematic plan view for explaining the structure of a magnetic sensor 3 according to a third embodiment of the present invention.

As illustrated in FIG. 11, the magnetic sensor 3 according to the third embodiment differs from the magnetic sensor 2 according to the second embodiment in the following points: a magnetic gap G3 extending in the y-direction is formed between the ferromagnetic films M11 and M12; a magnetic gap G4 extending in the y-direction is formed between the ferromagnetic films M11 and M13; a magnetoresistive strip S3 is disposed so as to overlap the magnetic gap G3; and a magnetoresistive strip S4 is disposed so as to overlap the magnetic gap G4. The magnetoresistive strips S3 and S4 each include a plurality of magnetoresistive elements R arranged in the y-direction through a plurality of hard magnetic members H. The direction D of a magnetic bias applied by each hard magnetic member H is the same in the magnetoresistive strips S1 to S4. The plurality of magnetoresistive elements R and plurality of hard magnetic members H constituting the magnetoresistive strip S3 overlap the ferromagnetic films M11 and M12. The plurality of magnetoresistive elements R and plurality of hard magnetic members H constituting the magnetoresistive strip S4 overlap the ferromagnetic films M11 and M13.

With this configuration, the magnetic field to be detected taken into the ferromagnetic film M11 through the external magnetic member 26 is distributed to the ferromagnetic films M12 and M13 through the magnetic gaps G1 to G4. The magnetic field to be detected going from the ferromagnetic film M11 to the ferromagnetic film M12 is applied in the negative x-direction to the magnetoresistive strips S1 and S3, and that going from the ferromagnetic film M11 to the ferromagnetic film M13 is applied in the positive x-direction to the magnetoresistive strips S2 and S4. That is, the application direction of the magnetic field to be detected to the magnetoresistive strips S1 and S3 and the application direction of the magnetic field to be detected to the magnetoresistive strips S2 and S4 are opposed to each other.

Figure 12:
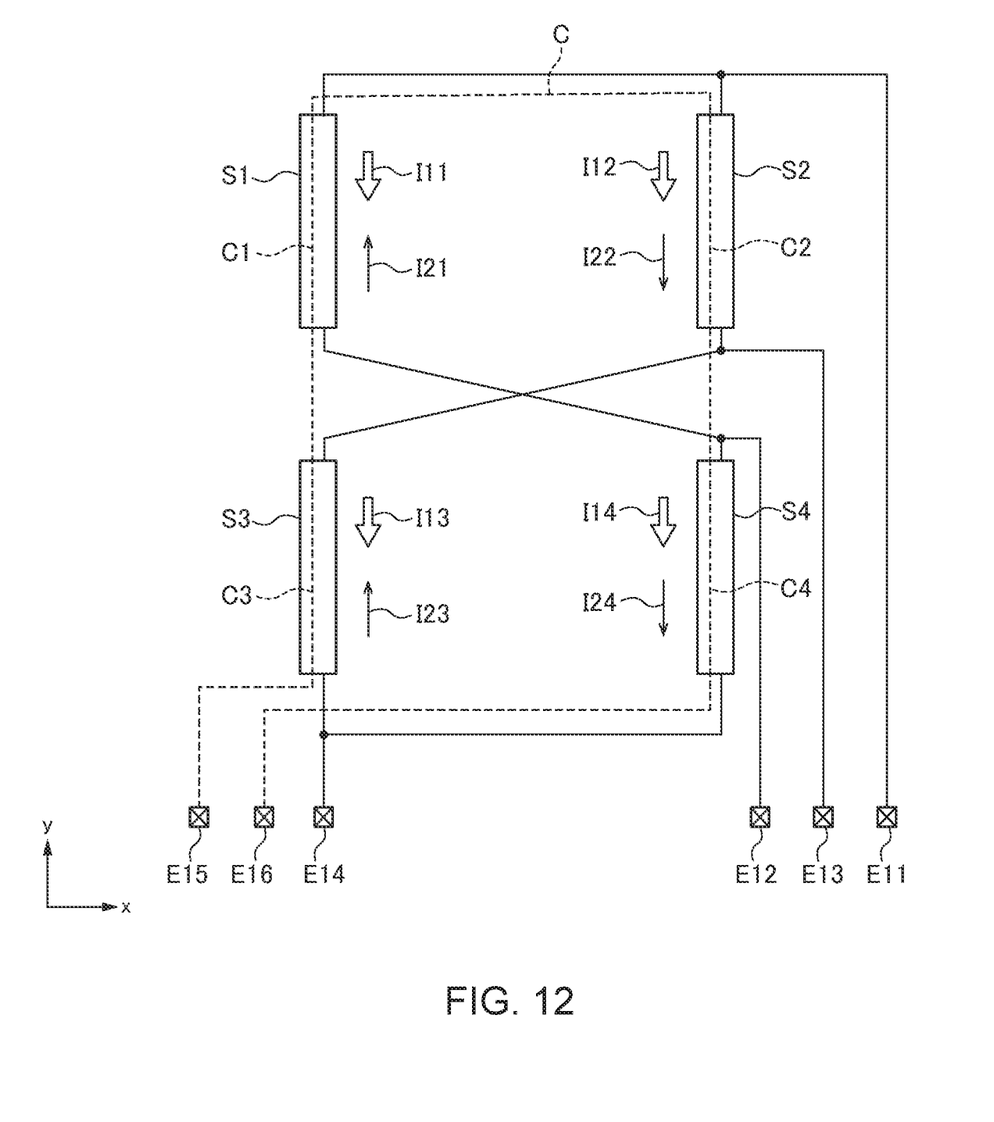
FIG. 12 is a schematic diagram for explaining a connection relation between the magnetoresistive strips S1-S4 and the compensating coil C and the terminal electrodes E11-E16.

The magnetoresistive strips S1 to S4 are connected as illustrated in FIG. 12: one end of the magnetoresistive strip S1 in the y-direction is connected to the terminal electrode E11, and the other end thereof is connected to the terminal electrode E12; one end of the magnetoresistive strip S2 in the y-direction is connected to the terminal electrode E13, and the other end thereof is connected to the terminal electrode E11; one end of the magnetoresistive strip S3 in the y-direction is connected to the terminal electrode E13, and the other end thereof is connected to the terminal electrode E14; and one end of the magnetoresistive strip S4 in the y-direction is connected to the terminal electrode E12, and the other end thereof is connected to the terminal electrode E14. As a result, the magnetoresistive strips S1 to S4 constitute a full-bridge circuit. In the present embodiment as well, connection between the terminal electrode (E11 to E14) and the magnetoresistive strip (S1 to S4) is made not through another magnetoresistive element with the magnetic field to be detected. Thus, when current is made to flow from the terminal electrode E11 toward the terminal electrode E14, current flows in the magnetoresistive strips S1 to S4 in the directions denoted by the arrows I11 to I14, respectively. That is, current flows in the magnetoresistive strip S1 to S4 in the same direction. Since the application direction of the magnetic field to be detected to the magnetoresistive strips S1 and S3 and application direction of the magnetic field to be detected to the magnetoresistive strips S2 and S4 are opposed to each other, it is possible to measure the direction and strength of the magnetic field to be detected by monitoring the voltage between the terminal electrodes E12 and E13 using a not-shown detection circuit.

Further, as illustrated in FIG. 12, one end of the compensating coil C is connected to the terminal electrode E15, and the other end thereof is connected to the terminal electrode E16. The compensating coil C is provided for applying a cancelling magnetic field to the magnetoresistive strips S1 to S4, whereby so-called closed-loop control can be performed. The compensating coil C includes a section C1 extending in the y-direction along the magnetoresistive strip S1, a section C2 extending in the y-direction along the magnetoresistive strip S2, a section C3 extending in the y-direction along the magnetoresistive strip S3, and a section C4 extending in the y-direction along the magnetoresistive strip S4. When current is made to flow from the terminal electrode E15 toward the terminal electrode E16, current flows in the sections C1 to C4 in the directions denoted by the arrows 121 to 124, respectively. That is, the direction of current flowing in the sections C1 and C3 and the direction of current flowing in the sections C2 and C4 are opposite to each other. This allows for cancellation of the magnetic fields to be detected applied in mutually opposite directions to the magnetoresistive strips S1, S3 and the magnetoresistive strips S2, S4 by means of the compensating coil C.

As described above, in the magnetic sensor 3 according to the present embodiment, the four magnetoresistive strips S1 to S4 do not have a folded structure and are connected such that current flows therein in the same direction. As a result, the relation between the direction of the magnetic bias and the direction of flow of current becomes constant over all the sections of each of the magnetoresistive strips S1 to S4. This significantly reduces random noise to allow for detection of an extremely weak magnetic field.

While the preferred embodiment of the present disclosure has been described, the present disclosure is not limited to the above embodiment, and various modifications may be made within the scope of the present disclosure, and all such modifications are included in the present disclosure.

For example, although both the ferromagnetic films M1 and M2 overlap the magnetoresistive strip S in the magnetic sensor 1 according to the first embodiment, only one of the ferromagnetic films M1 and M2 may overlap the magnetoresistive strip S.

Further, although the ferromagnetic films M1 and M2 overlap the plurality of magnetoresistive elements R and plurality of hard magnetic members H constituting the magnetoresistive strip S in the magnetic sensor 1 according to the first embodiment, the ferromagnetic films M1 and M2 may overlap the plurality of hard magnetic members H without overlapping the plurality of magnetoresistive elements R.

Further, although the protruding part B1 protrudes from the bottom surface B of each of the ferromagnetic films M1 and M2 in the magnetic sensor 1 according to the first embodiment, the protruding part B1 may not necessarily be formed in the present invention; the bottom surface B may be flat.

REFERENCE SIGNS LIST 1-3 magnetic sensor
11 sensor substrate
12, 13 insulating film
13a trench
21 sensor substrate
22-25 insulating film
26,27 external magnetic member
27 external magnetic member
B bottom surface of ferromagnetic film
B1 protruding part
B2 corner part
C compensating coil
C1-C4 section
D direction of magnetic bias
E1, E2, E11-E16 terminal electrode
G, G1-G4 magnetic gap
H hard magnetic member
H1, H2 end hard magnetic member
M1, M2, M11-M13 ferromagnetic film
R magnetoresistive element
S, S1-S4 magnetoresistive strip
φ magnetic bias

What is claimed is:

1. A magnetic sensor comprising:
   a first magnetoresistive strip including a plurality of magnetoresistive elements arranged in a first direction through a plurality of hard magnetic members that apply a magnetic bias;
   an insulating film that covers the first magnetoresistive strip; and
   first and second ferromagnetic films formed on the insulating film and arranged in a second direction crossing the first direction through a first magnetic gap extending in the first direction,
   wherein at least one of the first and second ferromagnetic films overlaps the plurality of hard magnetic members and the plurality of magnetoresistive elements through the insulating film.

2. The magnetic sensor as claimed in claim 1, wherein both the first and second ferromagnetic films overlap the plurality of hard magnetic members and plurality of magnetoresistive elements through the insulating film.

3. The magnetic sensor as claimed in claim 2,
   wherein a part of each of the first and second ferromagnetic films that overlaps the plurality of magnetoresistive elements has a protruding part protruding from a bottom surface thereof contacting the insulating film toward the plurality of magnetoresistive elements, and
   wherein a width of the protruding part in the first direction is smaller than a width of each of the plurality of magnetoresistive elements in the first direction.

4. The magnetic sensor as claimed in claim 1, wherein a thickness of the insulating film is 0.05 μm or more and 0.3 μm or less.

5. The magnetic sensor as claimed in claim 1, further comprising:
   a second magnetoresistive strip including a plurality of magnetoresistive elements arranged in the first direction through a plurality of hard magnetic members that apply a magnetic bias; and
   a third ferromagnetic film formed on the insulating film,
   wherein the first and third ferromagnetic films are arranged in the second direction through a second magnetic gap extending in the first direction, and
   wherein at least one of the first and third ferromagnetic films overlaps the plurality of hard magnetic members included in the second magnetoresistive strip through the insulating film.

6. The magnetic sensor as claimed in claim 5, further comprising a compensating coil that applies a cancelling magnetic field to the first and second magnetoresistive strips,
   wherein the compensating coil includes a first section extending in the first direction along the first magnetoresistive strip and a second section extending in the first direction along the second magnetoresistive strip, and
   wherein directions of current flowing in the first and second sections are opposite to each other.

7. The magnetic sensor as claimed in claim 5, further comprising third and fourth magnetoresistive strips each including a plurality of magnetoresistive elements arranged in the first direction through a plurality of hard magnetic members that apply a magnetic bias,
   wherein the first and second ferromagnetic films further form a third magnetic gap extending in the first direction,
   wherein the first and third ferromagnetic films further form a fourth magnetic gap extending in the first direction,
   wherein at least one of the first and second ferromagnetic films overlaps, through the insulating film, the plurality of hard magnetic members included in the third magnetoresistive strip, and
   wherein at least one of the first and third ferromagnetic films overlaps, through the insulating film, the plurality of hard magnetic members included in the fourth magnetoresistive strip.

8. The magnetic sensor as claimed in claim 7, further comprising a compensating coil that applies a cancelling magnetic field to the first to fourth magnetoresistive strips, wherein the compensating coil includes a first section extending in the first direction along the first magnetoresistive strip, a second section extending in the first direction along the second magnetoresistive strip, a third section extending in the first direction along the third magnetoresistive strip, and a fourth section extending in the first direction along the fourth magnetoresistive strip, wherein direction of current flowing in the first and third sections are the same, wherein direction of current flowing in the second and fourth sections are the same, and wherein directions of current flowing in the first and second sections are opposite to each other.

9. The magnetic sensor as claimed in claim 1, further comprising first and second terminal electrodes, wherein one end of the first magnetoresistive strip in the first direction is connected to the first terminal electrode not through another magnetoresistive element applied with a magnetic field to be detected, and wherein other end of the first magnetoresistive strip in the first direction is connected to the second terminal electrode not through another magnetoresistive element applied with the magnetic field to be detected.

10. A magnetic sensor comprising:
a first magnetoresistive strip including a plurality of magnetoresistive elements arranged in a first direction through a plurality of hard magnetic members that apply a magnetic bias;
a second magnetoresistive strip including a plurality of magnetoresistive elements arranged in the first direction through a plurality of hard magnetic members that apply a magnetic bias;
an insulating film that covers the first and second magnetoresistive strips;
first, second, and third ferromagnetic films formed on the insulating film; and
third and fourth magnetoresistive strips each including a plurality of magnetoresistive elements arranged in the first direction through a plurality of hard magnetic members that apply a magnetic bias, wherein the first and second ferromagnetic films are arranged in a second direction crossing the first direction through a first magnetic gap extending in the first direction, wherein the first and third ferromagnetic films are arranged in the second direction through a second magnetic gap extending in the first direction, wherein the first and second ferromagnetic films further form a third magnetic gap extending in the first direction, wherein the first and third ferromagnetic films further form a fourth magnetic gap extending in the first direction, wherein at least one of the first and second ferromagnetic films overlaps the plurality of hard magnetic members included in the first magnetoresistive strip through the insulating film, wherein at least one of the first and third ferromagnetic films overlaps the plurality of hard magnetic members included in the second magnetoresistive strip through the insulating film, and wherein at least one of the first and third ferromagnetic films overlaps, through the insulating film, the plurality of hard magnetic members included in the fourth magnetoresistive strip.

* * * * *